United States Patent
Yang et al.

(10) Patent No.: US 12,507,557 B2
(45) Date of Patent: *Dec. 23, 2025

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Lin Yang, Hubei (CN); Munjae Lee, Hubei (CN); Xianjie Li, Hubei (CN); Jiajia Luo, Hubei (CN); Xu Wang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/522,545

(22) Filed: Nov. 29, 2023

(65) Prior Publication Data

US 2024/0099089 A1 Mar. 21, 2024

Related U.S. Application Data

(63) Continuation of application No. 16/971,332, filed as application No. PCT/CN2020/082749 on Apr. 1, 2020, now Pat. No. 11,864,442.

(30) Foreign Application Priority Data

Dec. 26, 2019 (CN) .......................... 201911369011.6

(51) Int. Cl.
*H10K 59/35* (2023.01)
*H10K 50/11* (2023.01)
(Continued)

(52) U.S. Cl.
CPC ............. *H10K 59/35* (2023.02); *H10K 71/00* (2023.02); *H10K 85/654* (2023.02);
(Continued)

(58) Field of Classification Search
CPC .................................................. H10K 50/125
See application file for complete search history.

(56) References Cited

U.S. PATENT DOCUMENTS 9,793,493 B2 10/2017 Yen et al.
9,923,031 B2 3/2018 Gao et al.
(Continued)

FOREIGN PATENT DOCUMENTS

CN 104167428 11/2014
CN 104253146 12/2014
(Continued)

OTHER PUBLICATIONS

Computer-generated English-language translation of CN-109346500-A.*
(Continued)

*Primary Examiner* — Vu A Nguyen

(57) ABSTRACT

A display panel and manufacturing method thereof are provided. The display panel includes a substrate, a first electrode, a hole injection layer, a hole transport layer, an electron blocking layer, an organic electroluminescent layer, a hole blocking layer, an electron transport layer, an electron injection layer, and a second electrode arranged sequentially. The electron blocking layer corresponding to a green sub-pixel region of the organic electroluminescent layer is made of a p-type green light host material. Accordingly, the present invention effectively simplifies a manufacturing process, adjusts and balances charge carriers, and improves device performance.

8 Claims, 4 Drawing Sheets

(51) Int. Cl.
*H10K 59/12* (2023.01)
*H10K 71/00* (2023.01)
*H10K 85/60* (2023.01)
*H10K 102/00* (2023.01)

(52) U.S. Cl.
CPC ..... *H10K 85/6572* (2023.02); *H10K 85/6574* (2023.02); *H10K 50/11* (2023.02); *H10K 59/12* (2023.02); *H10K 59/1201* (2023.02); *H10K 2102/351* (2023.02)

(56) References Cited

U.S. PATENT DOCUMENTS

| | | | |
|---|---|---|---|
| 10,147,898 B2 * | 12/2018 | Tang | H10K 50/81 |
| 10,193,096 B2 | 1/2019 | Gao et al. | |
| 10,991,892 B2 | 4/2021 | Parham et al. | |
| 11,349,093 B2 | 5/2022 | Zhang et al. | |
| 2014/0131668 A1 * | 5/2014 | Kim | H10K 50/8445 438/46 |
| 2018/0323393 A1 | 11/2018 | Huang et al. | |
| 2019/0372022 A1 | 12/2019 | Yoon et al. | |

FOREIGN PATENT DOCUMENTS

| | | | |
|---|---|---|---|
| CN | 104870434 | 8/2015 | |
| CN | 105895820 | 8/2016 | |
| CN | 109273614 | 1/2019 | |
| CN | 109346500 A * | 2/2019 | .......... H01L 27/3211 |
| CN | 109360897 | 2/2019 | |
| CN | 109427985 | 3/2019 | |
| CN | 110551086 | 12/2019 | |
| KR | 10-1536568 | 7/2015 | |

OTHER PUBLICATIONS

International Search Report and the Written Opinion Dated Oct. 9, 2020 From the International Searching Authority Re. Application No. PCT/CN2020/082749 and Its Translation Into English. (14 Pages).

Notification of Office Action and Search Report Dated Sep. 1, 2020 From the State Intellectual Property Office of the People's Republic of China Re. Application No. 201911369011.6 and Its Translation Into English. (34 Pages).

Notification of Office Action and Search Report Dated Feb. 19, 2021 From the State Intellectual Property Office of the People's Republic of China Re. Application No. 201911369011.6 and Its Translation Into English. (35 Pages).

Notification of Office Action Dated Apr. 19, 2021 From the State Intellectual Property Office of the People's Republic of China Re. Application No. 201911369011.6 and Its Translation Into English. (29 Pages).

* cited by examiner

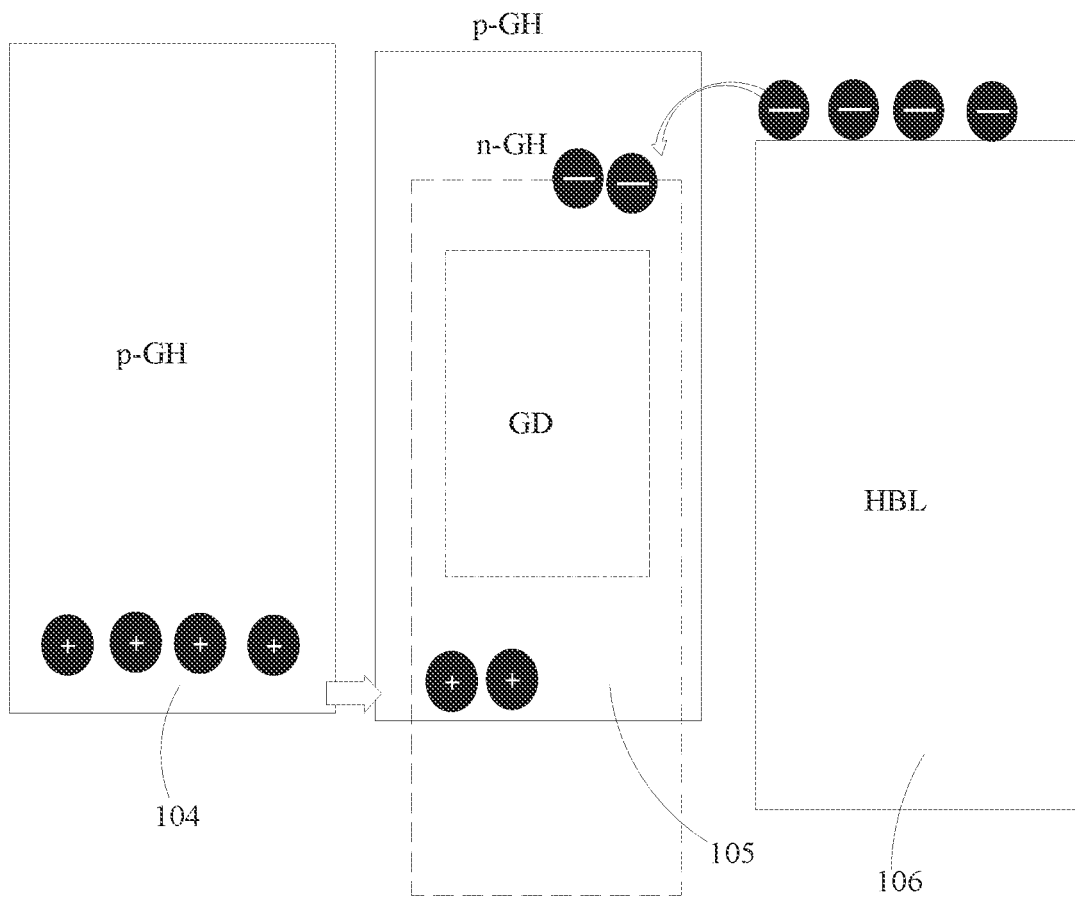

FIG. 6

Sequentially providing a substrate, a first electrode, a hole injection layer, a hole transport layer, an electron blocking layer, an organic electroluminescent layer, a hole blocking layer, an electron transport layer, an electron injection layer, and a second electrode, wherein a portion of the electron blocking layer corresponding to a green sub-pixel region of the organic electroluminescent layer is made of a p-type green light host material — S1

DISPLAY PANEL AND MANUFACTURING METHOD THEREOF

RELATED APPLICATIONS

This application is a Continuation of U.S. patent application Ser. No. 16/971,332 filed on Aug. 20, 2020, which is a National Phase of PCT Patent Application No. PCT/CN2020/082749 having International filing date of Apr. 1, 2020, which claims the benefit of priority of Chinese Patent Application No. 201911369011.6 filed on Dec. 26, 2019. The contents of the above applications are all incorporated by reference as if fully set forth herein in their entirety.

FIELD AND BACKGROUND OF THE INVENTION

The present invention relates to a field of organic light-emitting displays and in particular, to a display panel and a manufacturing method thereof.

DESCRIPTION OF RELATED ART

Conventional flat panel display devices include liquid crystal displays (LCDs), plasma display panels (PDP), organic light emitting diode (OLED) display devices, and etc. Especially, the OLED display devices have advantages such as low power consumption, high contrast ratios, and wide viewing angles, and being thin and flexible. OLED has now become the mainstream and next generation display technology. For OLED display devices which are active light-emitting devices, the OLED display devices include an ITO anode, a hole injection layer (HIL), a hole transport layer (HTL), an electron blocking layer (EBL), a light emitting layer (EML), a hole blocking layers (HBL), an electron transport layer (ETL), an electron injection layer (EIL), a cathode made of metal, and a cover layer. The light-emitting layer is the most important part of an OLED device, and includes a host material and a guest material. In an OLED device, electrons are injected from a cathode, and holes are injected from an anode, and an electron-hole pair is formed in a light-emitting layer to combine to generate an exciplex which is also called an exciton.

In order to improve an exciton utilization rate of the OLED device, that is, to increase the probability of energy transfer from the host material to the guest material, the following approach is taken. At present, a red light host material uses a certain ratio of an n-RH host material (n-RH) to a p-type host material (p-RH) to form a premixed material. By injecting this premixed material into electrons and holes, exciplexes are generated to increase the exciton utilization rate and thus increase efficiency and a service life of the device. However, when the red light premixed material is subjected to a evaporation deposition process, the ratio of the n-type host material to the p-type host material changes as the evaporation time goes by, resulting in low efficiency and a shorter service life of the device.

As shown in FIG. 1, in a conventional red light emitting device, a highest occupied molecular orbit (HOMO) energy level of the electron blocking layer (EBL) is poorly matched with an HOMO energy level of the p-type host material (p-RH), which causes a potential energy barrier to electron/hole migration and leads to degradation of device performance. Furthermore, the electron blocking layer and the light emitting layer need to be separately deposited in two different chambers by using at least two fine metal masks (FMM) for evaporation, so more manufacturing steps are required, and production costs are also increased.

SUMMARY OF THE INVENTION

It is an objective of the present invention to provide a display panel and a manufacturing method thereof, which only need the same one fine metal mask, and evaporation is performed in a same evaporation chamber, thus effectively simplifying a manufacturing process, adjusting and balancing charge carriers of the device, and improving device performance.

Accordingly, the present invention provides a display panel, comprising: a substrate, a first electrode, a hole injection layer, a hole transport layer, an electron blocking layer, an organic electroluminescent layer, a hole blocking layer, an electron transport layer, an electron injection layer, and a second electrode disposed sequentially, wherein the electron blocking layer corresponding to a green sub-pixel region of the organic electroluminescent layer is made of a p-type green light host material.

Preferably, the p-type green light host material is (2-(dibenzo[b,d]furan-3-yl)-4-(5-(dibenzo[b,d]furan-4-yl)-[1,1'-biphenyl]-3-yl)-6-phenyl-1,3,5-triazine) or (3-(3'-(4,6-diphenyl-1,3,5-triazin-2-yl)-[1,1'-biphenyl]-3-yl)-9-phenyl-9H-carbazole).

Preferably, a thickness of the hole injection layer is 30 to 500 angstroms (Å), a thickness of the hole transport layer is 100 to 2000 Å, and a thickness of the electron blocking layer is 100 to 2000 Å, a thickness of the organic electroluminescent layer is 30 to 800 Å, a thickness of the hole blocking layer is 10 to 500 Å, a thickness of the electron transport layer is 50 to 800 Å, a thickness of the electron injection layer is 5 to 400 Å, and a thickness of the second electrode is 50 to 300 Å.

Preferably, the electron blocking layer further comprises a red blocking portion arranged corresponding to a red sub-pixel region of the organic electroluminescent layer, and a blue blocking portion arranged corresponding to a blue sub-pixel region of the organic electroluminescent layer, wherein the p-type green light host material is disposed between the red blocking portion and the blue blocking portion.

Preferably, the display panel further comprises a cover layer, a protective layer, and an encapsulation layer sequentially disposed on the second electrode, wherein the substrate comprises a base substrate and a thin film transistor driving layer, and the first electrode is disposed on the thin film transistor driving layer.

The present invention further provides a display panel, comprising: a substrate, a first electrode, a hole injection layer, a hole transport layer, an electron blocking layer, an organic electroluminescent layer, a hole blocking layer, an electron transport layer, an electron injection layer, and a second electrode disposed sequentially, wherein the organic electroluminescent layer comprises a red sub-pixel region, a green sub-pixel region, and a blue sub-pixel region arranged spaced apart from each other, and the electron blocking layer corresponding to the green sub-pixel region is made of a p-type green light host material, wherein the electron blocking layer comprises a red blocking portion corresponding to the red sub-pixel region, and a blue blocking portion corresponding to the blue sub-pixel region.

Preferably, the p-type green light host material is (2-(dibenzo[b,d]furan-3-yl)-4-(5-(dibenzo[b,d]furan-4-yl)-[1,1'-biphenyl]-3-yl)-6-phenyl-1,3,5-triazine) or (3-(3'-(4,6-diphenyl-1,3,5-triazin-2-yl)-[1,1'-biphenyl]-3-yl)-9-phenyl- 9H-carbazole), a thickness of the electron blocking layer is 100 to 2000 angstroms (Å), and a thickness of the organic electroluminescent layer is 30 to 800 Å.

Preferably, a thickness of the hole injection layer is 30 to 500 Å, a thickness of the hole transport layer is 100 to 2000 Å, a thickness of the electron blocking layer is 100 to 2000 Å, a thickness of the organic electroluminescent layer is 30 to 800 Å, a thickness of the hole blocking layer is 10 to 500 Å, a thickness of the electron transport layer is 50 to 800 Å, a thickness of the electron injection layer is 5 to 400 Å, and a thickness of the second electrode is 50 to 300 Å.

Preferably, the electron blocking layer further comprises a red blocking portion corresponding to a red sub-pixel region of the organic electroluminescent layer, a blue blocking portion corresponding to a blue sub-pixel region of the organic electroluminescent layer, and the p-type green light host material is disposed between the red blocking portion and the blue blocking portion.

Preferably, the display panel further comprises a cover layer, a protective layer, and an encapsulation layer sequentially disposed on the second electrode, the substrate comprising a substrate and a thin film transistor driving layer, wherein the first electrode is disposed on the thin film transistor driving layer.

The present invention further provides a manufacturing method of a display panel, comprising steps as follows:
sequentially providing a substrate, a first electrode, a hole injection layer, a hole transport layer, an electron blocking layer, an organic electroluminescent layer, a hole blocking layer, an electron transport layer, an electron injection layer, and a second electrode;
wherein the electron blocking layer corresponding to a green sub-pixel region of the organic electroluminescent layer is made of a p-type green light host material.

Preferably, when the p-type green light host material is prepared in the green sub-pixel region, a baffle of the p-type green light host material evaporation source is opened, and a baffle of a green light dopant material evaporation source and a baffle of an n-type green light host material evaporation source are closed, so that the p-type green light host material is deposited on the hole transport layer.

Preferably, when the organic electroluminescent layer is produced, the baffles of the p-type green light host material evaporation source, the green light dopant material evaporation source, and the n-type green light host material evaporation source are opened at the same time, and the p-type green light host material, the green light dopant material, and the n-type green light host material are mixed together.

Preferably, a mixing ratio of the p-type green light host material and the n-type green light host material is adjusted by an evaporation rate, and a doping ratio of the green light dopant material is adjusted by the evaporation rate.

Preferably, areas for evaporation deposition of the p-type green light host material, the green light dopant material, and the n-type green light host material are controlled by an angle limiting plate of a fine metal mask.

The present invention has the following advantages. In the present invention, a p-type green light host material is used to replace a material of a portion of the electron blocking layer corresponding to the green sub-pixel region of the organic electroluminescent layer. Evaporation equipment requires no extra evaporation chambers to produce the electron blocking layer, so a manufacturing process is simplified, and manufacturing costs are reduced. Furthermore, the mixing ratio of the p-type green light host material (p-GH) and the n-type green light host material (n-GH) in the display panel of the present invention is effectively controlled by the evaporation rate through the evaporation equipment, and no changes occur as the evaporation time passes, thereby increasing the quality and reliability of the device.

BRIEF DESCRIPTION OF THE SEVERAL VIEW OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

FIG. 6 is a schematic view illustrating energy levels of the display panel of the present invention.

FIG. 7 is a process flow diagram illustrating a manufacturing method of the display panel according to the present invention.

DESCRIPTION OF SPECIFIC EMBODIMENTS OF THE INVENTION

In the present disclosure, "embodiment" means that a particular feature, structure, or characteristic described in connection with the embodiment can be included in at least one embodiment of the present invention. The use of the same terms in different places in the specification is not necessarily limited to the same embodiment, but should be understood as being for independent or alternative embodiments. Based on the technical solutions disclosed in the embodiments of the present invention, those skilled in the art should be able to make modifications or combinations according to the concept of the present invention.

Figure 1:
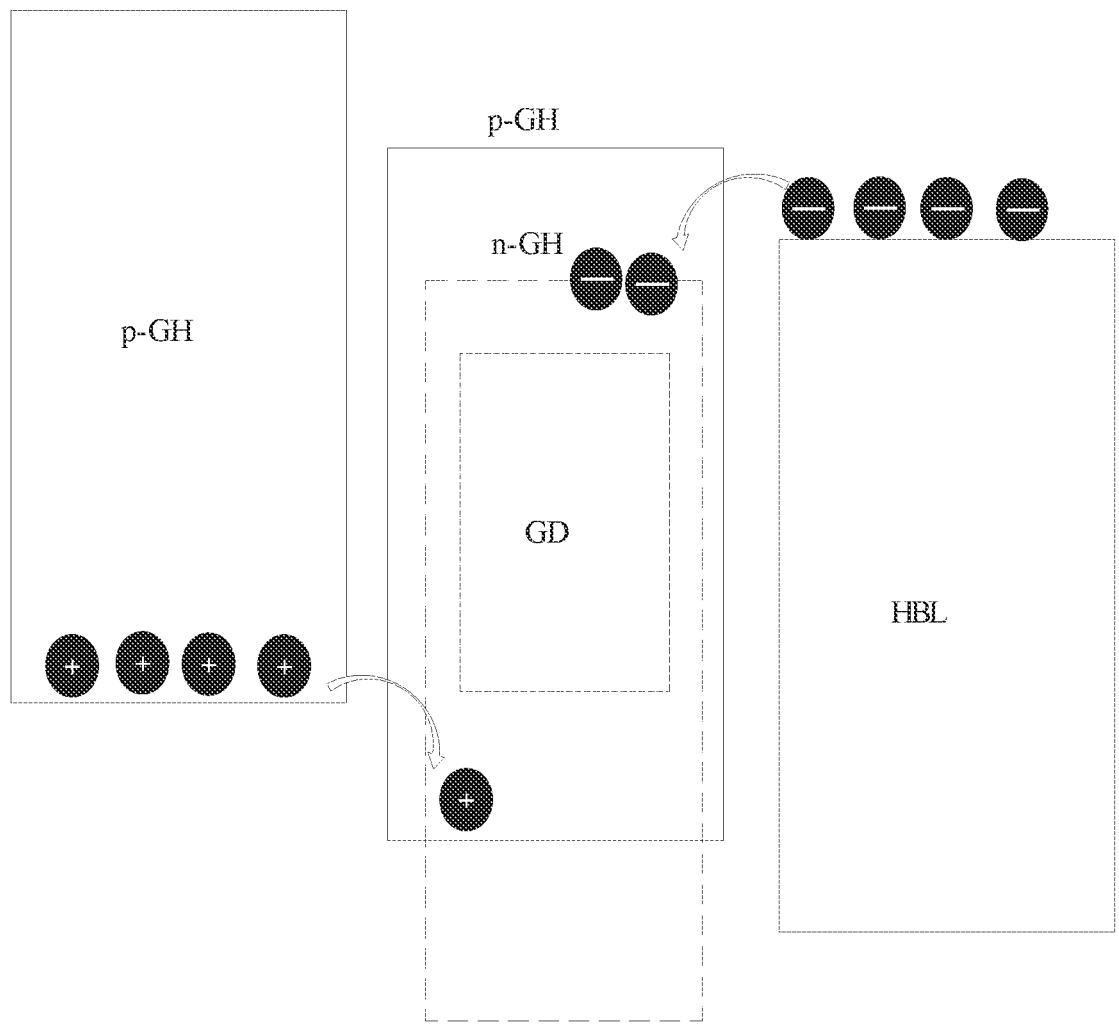
FIG. 1 is a schematic diagram illustrating energy levels of a conventional display panel.
Figure 2:
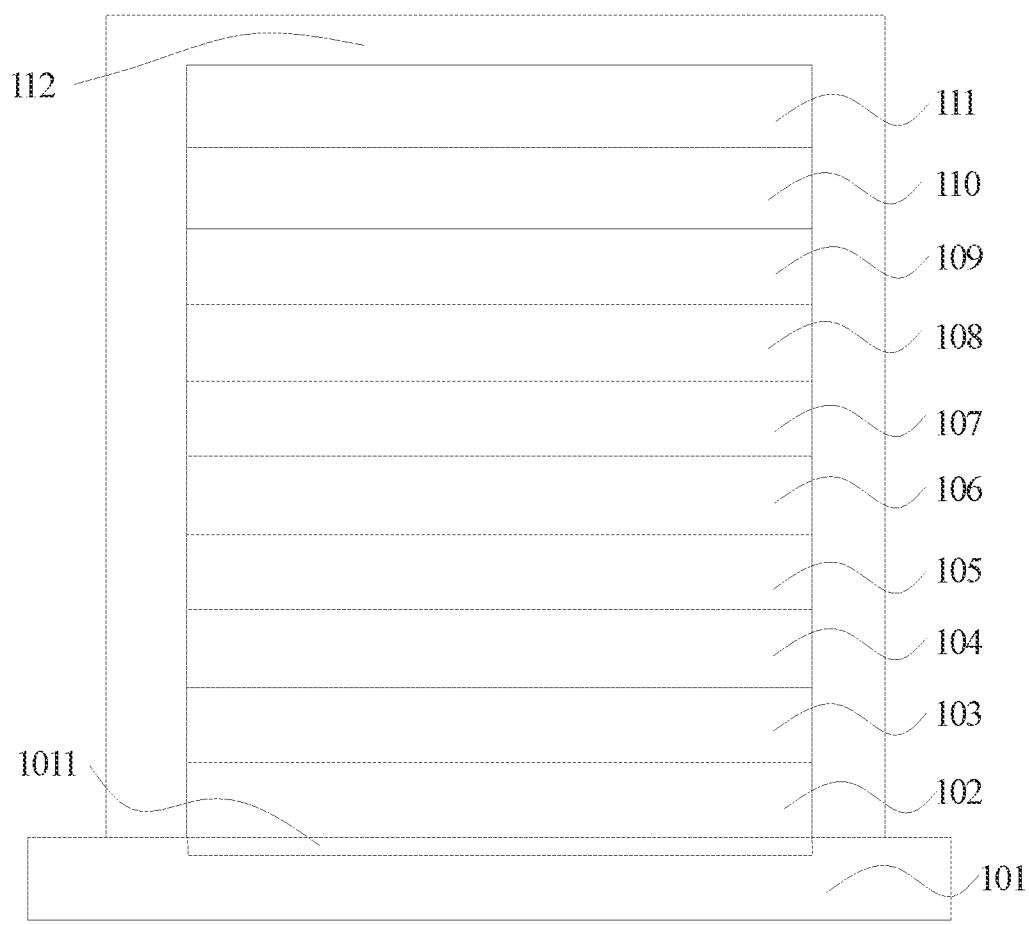
FIG. 2 is a schematic cross-sectional view illustrating a display panel according to the present invention.
Figure 3:
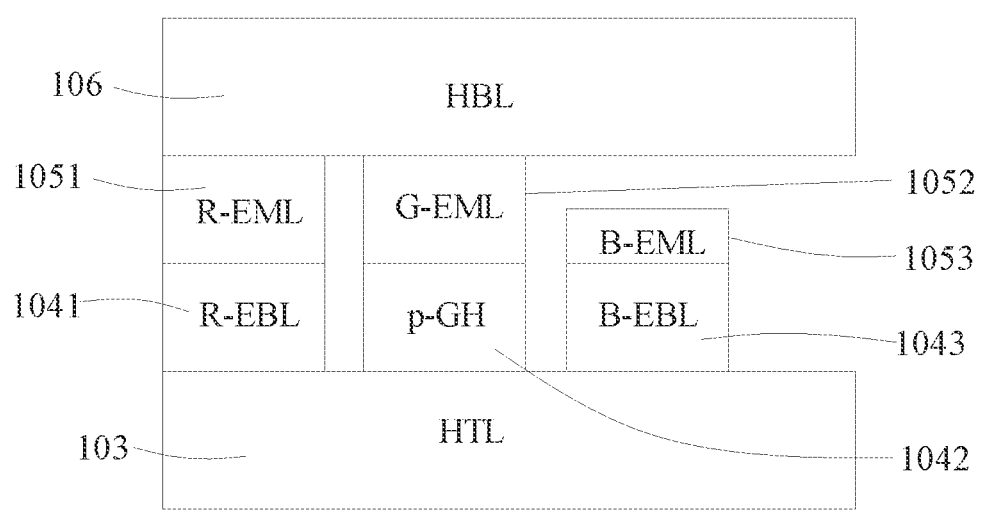
FIG. 3 is a schematic cross-sectional view illustrating an electron blocking layer and an organic electroluminescent layer of the display panel according to the present invention.

Please refer to FIGS. 2 and 3. FIG. 2 is a schematic cross-sectional view illustrating a display panel of the present invention. FIG. 3 is a schematic cross-sectional view illustrating an electron blocking layer and an organic electroluminescent layer of the display panel of the present invention. As shown in the drawings, the present invention provides a display panel 1 including a substrate 101, a first electrode 1011, a hole injection layer 102, a hole transport layer 103, an electron blocking layer 104, an organic electroluminescent layer 105, a hole blocking layer 106, an electron transport layer 107, an electron injection layer 108, and a second electrode 109. The electron blocking layer 104 corresponding to a green sub-pixel region 1052 of the organic electroluminescent layer 105 is made of a p-type green light host material 1042.

The display panel 1 can be used in, for example, a wearable device such as a smart bracelet, a smart watch, a virtual reality (VR) device, a mobile phone, an e-book/e-newspaper, a television, a personal portable computer, a foldable/flexible OLED display device. In the present embodiment, the p-type green light host material 1042 is (2-(dibenzo[b,d]furan-3-yl)-4-(5-(dibenzo[b,d]furan-4-yl)[1,1'-biphenyl]-3-yl)-6-phenyl-1,3,5-triazine), and its bond-line formula is as follows:

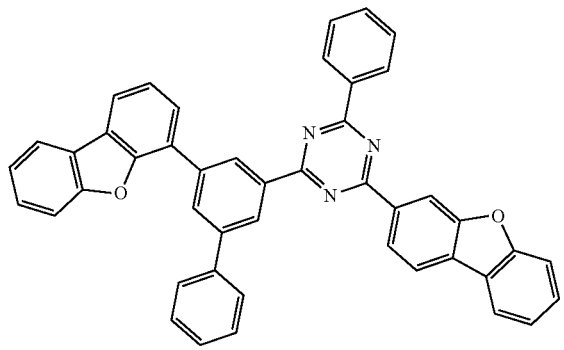 [SMILES: c1ccc(-c2cc(-c3nc(-c4ccccc4)nc(-c4ccc5c(c4)oc4ccccc45)n3)cc(-c3cccc4c3oc3ccccc34)c2)cc1]

Alternatively, the p-type green light host material 1042 is (3-(3'-(4,6-diphenyl-1,3,5-triazin-2-yl)[1,1'-biphenyl]-3-yl)-9-phenyl-9H-carbazole), and its bond-line formula is as follows:

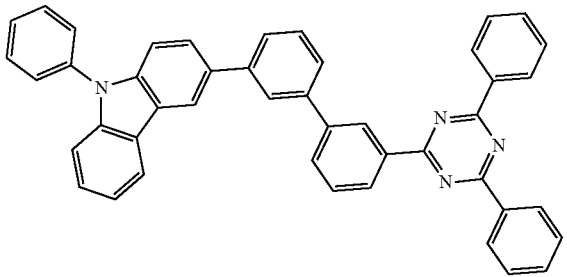 [SMILES: c1ccc(-c2nc(-c3ccccc3)nc(-c3cccc(-c4cccc(-c5ccc6c(c5)c5ccccc5n6-c5ccccc5)c4)c3)n2)cc1]

The substrate 101 comprises, but is not limited to, a rigid substrate or a flexible substrate, and its structure includes a base substrate (not illustrated) and a thin film transistor (TFT) driving layer (not illustrated) arranged sequentially. The first electrode 1011 is disposed on the TFT driving layer, and the first electrode 1011 is an anode (generally, indium tin oxide, or ITO for short). The TFT driving layer comprises, but is not limited to, an a-Si TFT, a low temperature poly-silicon (LTPS) TFT, or other suitable TFTs. The second electrode 109 is a cathode and has a thickness of 50-300 angstroms (Å). When the second electrode 109 is electrically connected to the first electrode 1011, sub-pixels in the organic electroluminescent layer 105 are driven to emit light. As shown in FIG. 3, the electron blocking layer 104 includes a red blocking portion 1041 corresponding to the red sub-pixel region 1051 of the organic electroluminescent layer 105, and also includes a blue blocking portion 1043 corresponding to the blue sub-pixel region 1053 of the organic electroluminescent layer 105. The p-type green light host material 1042 is disposed between the red blocking portion 1041 and the blue blocking portion 1043. In a preferable embodiment, the display panel 1 can emit only green light; however, in other embodiments, the display panel 1 can also include red sub-pixels (not labeled) and blue sub-pixels (not labeled) and emit visible light of various colors.

The hole injection layer 102 is disposed on the substrate 101. The hole injection layer 102 is, for example, a conventional p-type dopant material, a Copper Phthalocyanine (CuPc), titanyl phthalocyanine (TiOPc), m-MTDATA, 2-TNATA, or other energy level matching materials. A thickness of the hole injection layer 102 is 30 to 500 Å. The hole transport layer 103 is disposed on the hole injection layer 102 and has a thickness of 100 to 2000 Å. The electron blocking layer 104 is disposed on the hole transport layer 103 and has a thickness of 100 to 2000 Å.

The hole blocking layer 106 is disposed on the organic electroluminescent layer 105 and has a thickness of 10 to 500 Å. The electron transport layer 107 is disposed on the hole blocking layer 106 and has a thickness of 50 to 800 Å. Material of the electron transport layer 107 includes, but is not limited to, one or more of Alq3, Almq3, DVPBi, TAZ, OXD, PBD, BND, and PV. The electron injection layer 108 is disposed on the electron transport layer 107 and has a thickness of 5 to 400 Å.

In the embodiment shown in FIG. 2, the present invention further includes a cover layer 110, a protective layer 111, and an encapsulation layer 112 disposed on the second electrode 109 in sequence. The cover layer 110 is disposed on the second electrode 109 and has a thickness of 20 to 2000 Å. The cover layer 110 is a film layer for improving a light output rate. Material of the protective layer 111 includes, but is not limited to, lithium fluoride (LiF). The encapsulation layer 112 simultaneously covers the protective layer 111, the cover layer 110, the second electrode 109, the electron injection layer 108, the electron transport layer 107, the hole blocking layer 106, the organic electroluminescent layer 105, the electron blocking layer 104, the hole transport layer 103, the hole injection layer 102, and the first electrode 101 to protect the display panel 1 from being damaged by impurities such as moisture and dust.

The present invention further provides a manufacturing method of a display panel. As shown in FIG. 7, the manufacturing method includes following steps. Step S1: sequentially providing a substrate 101, a first electrode 1011, a hole injection layer 102, a hole transport layer 103, an electron blocking layer 104, an organic electroluminescent layer 105, a hole blocking layer 106, an electron transport layer 107, an electron injection layer 108, and a second electrode 109. A portion of the electron blocking layer 104 corresponding to a green sub-pixel region 1052 of the organic electroluminescent layer 105 is made of a p-type green light host material 1042.

Figure 4:
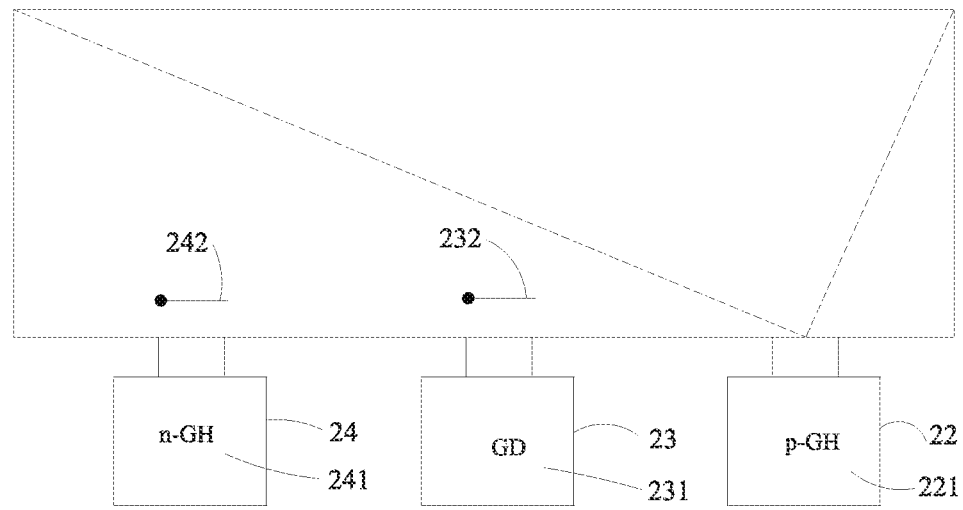
FIG. 4 is a schematic view illustrating evaporation deposition for the display panel in an evaporation chamber of evaporation equipment.
Figure 5:
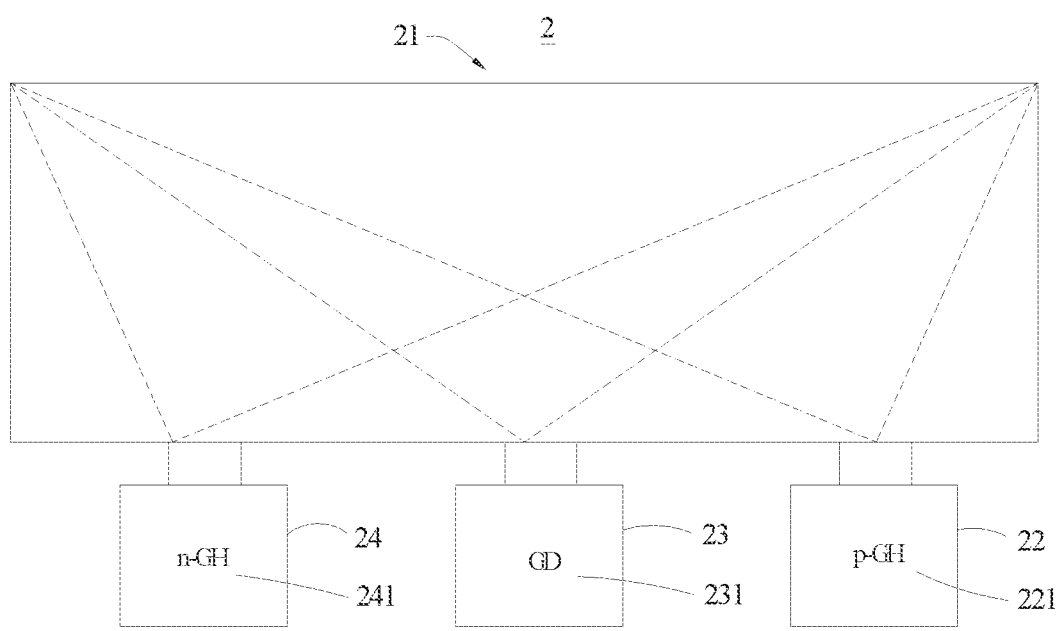
FIG. 5 is another schematic view illustrating evaporation deposition for the display panel in the evaporation chamber of the evaporation equipment.

Please refer to FIGS. 4 to 6. Vacuum multi-effect evaporation equipment 2 is taken as an example for description. When evaporation-depositing the p-type green light host material 1042 corresponding to the green sub-pixel region 1052 of the organic electroluminescent layer 105 is performed in a same evaporation chamber 21 of the evaporation equipment 2. A p-type green light host material evaporation source 22, a green light dopant material evaporation source 23, and an n-type green light host material evaporation source 24 are respectively connected to the evaporation chamber 21 at intervals. When the p-type green light host material 1042 is evaporated, a baffle (not illustrated) of the p-type green light host material evaporation source 22 is opened, and a baffle 232 of the red light dopant material evaporation source 23 and a baffle 242 of the n-type green light host material evaporation source 24 are closed, so that a p-type green light host material 221 (organic dye) is uniformly and stably evaporation-deposited on the hole transport layer 103.

The organic electroluminescent layer 105 is produced by mixing and depositing the p-type green host material (p-GH) 221, the green light dopant material (GD) 231, and the n-type green host material (n-GH) 241. A thickness of the organic electroluminescent layer 105 ranges from 30 Å to 800 Å. When the organic electroluminescent layer 105 is deposited, the baffle (not illustrated) of the p-type green light host material evaporation source 22 and the baffle 232 of the green light dopant material evaporation source 23 and the baffle 242 of the n-type green light host material evaporation source 24 are opened at the same time, so that the p-type green light host material 221, the green light dopant material 231, and the n-type green light host material 241 are mixed in the evaporation chamber 21.

A mixing ratio of the p-type green light host material 221 and the n-type green light host material 241 is adjusted by an evaporation rate through the evaporation equipment 2, and a doping ratio of the green light dopant material 231 is also adjusted by the evaporation rate. Areas for evaporation deposition of the p-type green light host material 221, the red light dopant material 231, and the n-type green light host material 241 are controlled by an angle limiting plate (not illustrated) of a fine metal mask (not illustrated).

In another embodiment, before depositing the p-type green light host material 1042, the same fine metal mask is used to deposit the electron blocking layer and a blue light-emitting material (not illustrated), and the same fine metal mask is used to deposit the electron blocking layer and a red light-emitting material (not illustrated) on the blue light-emitting material; configuration may vary as needed to produce display devices as required. Please also refer to FIG. 6. When the p-type green light host material 1042 (p-GH) of the present embodiment is used to replace a portion of the electron blocking layer (EBL) 104 corresponding to the green sub-pixel region 1052, the p-type green light host material 1042 has a highest occupied molecular orbital (HOMO) energy level that matches a HOMO energy level of the green sub-pixel region 1052 in the organic electroluminescent layer 105, thus enhancing electron(+)/hole(−) migration, thereby balancing charge carriers of the display panel 1 and improving product performance thereof.

The present embodiment further includes the protective layer 111 deposited on the cover layer 110 and the encapsulation layer 112 deposited on the protective layer 111. The encapsulation layer 112 covers the hole injection layer 102, the hole transport layer 103, the electron blocking layer 104, the organic electroluminescent layer 105, the hole blocking layer 106, the electron transport layer 107, the electron injection layer 108, a cathode 109, the cover layer 110 on the substrate 101 by physical vapor deposition (PVD), chemical vapor deposition (CVD) or other suitable deposition methods, so that the display panel 1 is encapsulated and protected from the influence of moisture and oxygen, and the device performance is not reduced.

Methods of producing the layers on the substrate 101 include, but are not limited to, evaporation deposition, inkjet printing, or other suitable methods. The specific method is described in the foregoing examples, and will not be repeated here.

It should be noted that, depositing the p-type green light host material 1042 and the organic electroluminescent layer 105 are carried out using the same fine metal mask (not illustrated) in the same evaporation chamber 21, so the manufacturing process is effectively simplified, the charge carriers of the device are balanced, and the device performance is improved. Specifically, in the present embodiment, the p-type green light host material 1042 is used to replace a material of a portion of the electron blocking layer 104 corresponding to the green sub-pixel region 1052 of the organic electroluminescent layer 105. Therefore, it is not necessary to prepare an additional evaporation chamber (not illustrated) in the equipment and a different fine metal mask (not illustrated) for producing the electron blocking layer 104. Accordingly, a manufacturing process is simplified, and production costs are reduced. Furthermore, a mixing ratio of the p-type green light host material 221 (p-GH) and the n-type green light host material 241 (n-GH) in the display panel 1 is effectively controlled by an evaporation rate of the evaporation equipment 2, and does not change as the evaporation time increases, thereby increasing device quality and reliability.

In summary, although the present invention has been described in connection with specific embodiments, it should be understood that many alternatives, modifications, and variations will be apparent to those skilled in the art. The present invention is therefore intended to cover all alternatives, modifications, and variations that fall within the scope of the appended claims.

What is claimed is:

1. A display panel, comprising a substrate, a first electrode, a hole injection layer, a hole transport layer, an electron blocking layer, an organic electroluminescent layer, a hole blocking layer, an electron transport layer, an electron injection layer, and a second electrode disposed sequentially, wherein the organic electroluminescent layer comprises a first sub-pixel region, the organic electroluminescent layer comprises a p-type host material and a n-type host material, and a portion of the electron blocking layer corresponding to the first sub-pixel region is made of the p-type host material of the organic electroluminescent layer corresponding to the first sub-pixel region,
wherein the display panel further comprises a cover layer, a protective layer, and an encapsulation layer sequentially disposed on the second electrode, wherein the substrate comprises a base substrate and a thin film transistor driving layer, and the first electrode is disposed on the thin film transistor driving layer,
wherein the p-type host material of the organic electroluminescent layer corresponding to the first sub-pixel region is (2-(dibenzo[b,d]furan-3-yl)-4-(5-(dibenzo[b,d]furan-4-yl)-[1,1'-biphenyl]-3-yl)-6-phenyl-1,3,5-triazine) or (3-(3'-(4,6-diphenyl-1,3,5-triazin-2-yl)-[1,1'-biphenyl]-3-yl)-9-phenyl-9H-carbazole).

2. The display panel according to claim 1, wherein a thickness of the hole injection layer is 30 to 500 angstroms (Å), a thickness of the hole transport layer is 100 to 2000 Å, and a thickness of the electron blocking layer is 100 to 2000 Å, a thickness of the organic electroluminescent layer is 30 to 800 Å, a thickness of the hole blocking layer is 10 to 500 Å, a thickness of the electron transport layer is 50 to 800 Å, a thickness of the electron injection layer is 5 to 400 Å, and a thickness of the second electrode is 50 to 300 Å.

3. The display panel according to claim 1, wherein the electron blocking layer further comprises a second sub-pixel region, a third sub-pixel region, a first blocking portion arranging corresponding to the first sub-pixel region, a second blocking portion arranged corresponding to the second sub-pixel region, and a third blocking portion arranged corresponding to the third sub-pixel region, wherein the p-type host material is disposed between the second blocking portion and the third blocking portion.

4. The display panel according to claim 3, wherein the first sub-pixel region, the second sub-pixel region, and the third sub-pixel region are a green sub-pixel region, a red sub-pixel region, and a blue sub-pixel region, respectively.

5. A display panel, comprising a substrate, a first electrode, a hole injection layer, a hole transport layer, an electron blocking layer, an organic electroluminescent layer, a hole blocking layer, an electron transport layer, an electron injection layer, and a second electrode disposed sequentially, wherein the organic electroluminescent layer comprises a first sub-pixel region, a second sub-pixel region, and a third sub-pixel region arranged spaced apart from each other, the organic electroluminescent layer comprises a p-type host material and a n-type host material, and a portion of the electron blocking layer corresponding to the first sub-pixel region is made of the p-type host material of the organic electroluminescent layer corresponding to the first sub-pixel region,
wherein the display panel further comprises a cover layer, a protective layer, and an encapsulation layer sequentially disposed on the second electrode, wherein the substrate comprises a base substrate and a thin film transistor driving layer, and the first electrode is disposed on the thin film transistor driving layer,
wherein the p-type host material of the organic electroluminescent layer corresponding to the first sub-pixel region is (2-(dibenzo[b,d]furan-3-yl)-4-(5-(dibenzo[b,d]furan-4-yl)-[1,1'-biphenyl]-3-yl)-6-phenyl-1,3,5-triazine) or (3-(3'-(4,6-diphenyl-1,3,5-triazin-2-yl)-[1,1'-biphenyl]-3-yl)-9-phenyl-9H-carbazole).

6. The display panel according to claim 5, wherein a thickness of the hole injection layer is 30 to 500 Å, a thickness of the hole transport layer is 100 to 2000 Å, a thickness of the electron blocking layer is 100 to 2000 Å, a thickness of the organic electroluminescent layer is 30 to 800 Å, a thickness of the hole blocking layer is 10 to 500 Å, a thickness of the electron transport layer is 50 to 800 Å, a thickness of the electron injection layer is 5 to 400 Å, and a thickness of the second electrode is 50 to 300 Å.

7. The display panel according to claim 5, wherein the electron blocking layer comprises a first blocking portion arranging corresponding to the first sub-pixel region, a second blocking portion arranged corresponding to a second sub-pixel region, and a third blocking portion arranged corresponding to a third sub-pixel region, wherein the p-type host material is disposed between the second blocking portion and the third blocking portion.

8. The display panel according to claim 7, wherein the first sub-pixel region, the second sub-pixel region, and the third sub-pixel region are a green sub-pixel region, a red sub-pixel region, and a blue sub-pixel region, respectively.

* * * * *